United States Patent
Goto et al.

(10) Patent No.: US 10,224,078 B2
(45) Date of Patent: Mar. 5, 2019

(54) SEMICONDUCTOR DEVICE AND REFRESH RATE CONTROL METHOD OF SEMICONDUCTOR DEVICE BASED ON MEASURED TEMPERATURE

(71) Applicant: FUJITSU LIMITED, Kawasaki-shi, Kanagawa (JP)

(72) Inventors: Yoshitsugu Goto, Kawasaki (JP); Makoto Suwada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 13 days.

(21) Appl. No.: 15/792,839

(22) Filed: Oct. 25, 2017

(65) Prior Publication Data
US 2018/0166123 A1    Jun. 14, 2018

(30) Foreign Application Priority Data
Dec. 9, 2016    (JP) .................................. 2016-239175

(51) Int. Cl.
| | | |
|---|---|---|
| G11C 7/00 | (2006.01) | |
| G11C 11/406 | (2006.01) | |
| G11C 8/12 | (2006.01) | |
| G11C 5/04 | (2006.01) | |
| G11C 7/04 | (2006.01) | |

(Continued)

(52) U.S. Cl.
CPC ............ G11C 7/00 (2013.01); G06F 13/1636 (2013.01); G11C 5/04 (2013.01); G11C 7/04 (2013.01); G11C 8/12 (2013.01); G11C 11/40607 (2013.01); G11C 11/40618 (2013.01); G11C 11/40626 (2013.01); H01L 25/00 (2013.01); G11C 2211/4062 (2013.01)

(58) Field of Classification Search
CPC ....... G11C 11/40626; G11C 7/04; G11C 5/04; G11C 11/40607; G11C 8/12; G11C 2211/4062
See application file for complete search history.

(56) References Cited

U.S. PATENT DOCUMENTS

| | | | | |
|---|---|---|---|---|
| 7,233,538 B1 * | 6/2007 | Wu | ........................ | G11C 11/406 365/222 |
| 2011/0205826 A1 * | 8/2011 | Kuroda | ................. | G11C 11/406 365/222 |

(Continued)

FOREIGN PATENT DOCUMENTS

| | | |
|---|---|---|
| JP | 2015-041395 | 3/2015 |
| JP | 2016-048592 | 4/2016 |

*Primary Examiner* — Ajay Ojha
(74) *Attorney, Agent, or Firm* — Fujitsu Patent Center

(57) ABSTRACT

A semiconductor device in which a plurality of chips each including a memory circuit are stacked, the semiconductor device includes measurement circuitry each of which is disposed in each of a plurality of memory areas of the plurality of chips and each of which measures a temperature, calculation circuitry that calculates a temperature of each of the memory areas based on the temperature measured by the measurement circuitry and a temperature obtained from a thermal resistance model of the semiconductor device, and control circuitry that sets a refresh interval of each of the memory areas based on the temperature of each of the memory areas, which has been calculated by the calculation circuitry, and performs a refresh operation of the memory circuit of each of the memory areas at the set refresh interval.

7 Claims, 10 Drawing Sheets

(51) Int. Cl.
*G06F 13/16* (2006.01)
*H01L 25/00* (2006.01)

(56) References Cited

U.S. PATENT DOCUMENTS

| | | | |
|---|---|---|---|
| 2014/0281311 A1* | 9/2014 | Walker | G06F 3/0631 |
| | | | 711/162 |
| 2016/0064063 A1 | 3/2016 | Nomura et al. | |
| 2016/0125921 A1 | 5/2016 | Kambegawa | |
| 2016/0356655 A1* | 12/2016 | Tsurumaru | H01L 29/7395 |

* cited by examiner

FIG. 5

| RAx | AREA | SETTING VALUE | RAx | AREA | SETTING VALUE | RAx | AREA | SETTING VALUE |
|---|---|---|---|---|---|---|---|---|
| RA1 | A1 | 48 | RA11 | A3 | 61 | RA21 | A5 | 51 |
| RA2 | A1 | 49 | RA12 | A3 | 64 | RA22 | A5 | 50 |
| RA3 | A2 | 55 | RA13 | A4 | 46 | RA23 | A6 | 64 |
| RA4 | A2 | 54 | RA14 | A4 | 46 | RA24 | A6 | 63 |
| RA5 | A3 | 63 | RA15 | A5 | 53 | RA25 | A4 | 41 |
| RA6 | A3 | 61 | RA16 | A5 | 51 | RA26 | A4 | 48 |
| RA7 | A1 | 44 | RA17 | A6 | 65 | RA27 | A5 | 50 |
| RA8 | A1 | 49 | RA18 | A6 | 66 | RA28 | A5 | 49 |
| RA9 | A2 | 52 | RA19 | A4 | 47 | RA29 | A6 | 65 |
| RA10 | A2 | 52 | RA20 | A4 | 45 | RA30 | A6 | 66 |

FIG. 6

| Tm (MOMORY CELL TEMPERATURE) [°C] | REFRESH INTERVAL [μs] |
|---|---|
| Ta ≦ Tm | Ca |
| Tb ≦ Tm < Ta | Cb |
| Tc ≦ Tm < Tb | Cc |

FIG. 9A

| RAx | AREA | SETTING VALUE | MAX VALUE IN AREA (°C) | SENSOR VALUE (°C) | DIFFERENCE (°C) | Tm(n) (°C) | RAx CORRECTION |
|---|---|---|---|---|---|---|---|
| RA1 | A1 | 48 | 49 | 44 | 5 | 44 | 48 |
| RA2 | | 49 | | | | | 44 |
| RA7 | | 44 | | | | | 44 |
| RA8 | | 49 | | | | | 44 |
| RA3 | A2 | 55 | 55 | 52 | 3 | 55 | 55 |
| RA4 | | 54 | | | | | 54 |
| RA9 | | 52 | | | | | 52 |
| RA10 | | 52 | | | | | 52 |
| RA5 | A3 | 63 | 64 | 65 | -1 | 64 | 63 |
| RA6 | | 61 | | | | | 61 |
| RA11 | | 61 | | | | | 61 |
| RA12 | | 64 | | | | | 64 |
| RA13 | A4 | 46 | 48 | 49 | -1 | 48 | 46 |
| RA14 | | 46 | | | | | 46 |
| RA19 | | 47 | | | | | 47 |
| RA20 | | 45 | | | | | 45 |
| RA25 | | 41 | | | | | 41 |
| RA26 | | 48 | | | | | 48 |
| RA15 | A5 | 53 | 53 | 56 | -3 | 53 | 53 |
| RA16 | | 51 | | | | | 51 |
| RA21 | | 51 | | | | | 51 |
| RA22 | | 50 | | | | | 50 |
| RA27 | | 50 | | | | | 50 |
| RA28 | | 49 | | | | | 49 |
| RA17 | A6 | 65 | 66 | 62 | 4 | 66 | 65 |
| RA18 | | 66 | | | | | 66 |
| RA23 | | 64 | | | | | 64 |
| RA24 | | 63 | | | | | 63 |
| RA29 | | 65 | | | | | 65 |
| RA30 | | 66 | | | | | 66 |

FIG. 9B

| RAx | AREA | SETTING VALUE | RAx | AREA | SETTING VALUE | RAx | AREA | SETTING VALUE |
|---|---|---|---|---|---|---|---|---|
| RA1 | A1 | 48 | RA11 | A3 | 61 | RA21 | A5 | 51 |
| RA2 | A1 | 44 | RA12 | A3 | 64 | RA22 | A5 | 50 |
| RA3 | A2 | 55 | RA13 | A4 | 46 | RA23 | A6 | 64 |
| RA4 | A2 | 54 | RA14 | A4 | 46 | RA24 | A6 | 63 |
| RA5 | A3 | 63 | RA15 | A5 | 53 | RA25 | A4 | 41 |
| RA6 | A3 | 61 | RA16 | A5 | 51 | RA26 | A4 | 48 |
| RA7 | A1 | 44 | RA17 | A6 | 65 | RA27 | A5 | 50 |
| RA8 | A1 | 44 | RA18 | A6 | 66 | RA28 | A5 | 49 |
| RA9 | A2 | 52 | RA19 | A4 | 47 | RA29 | A6 | 65 |
| RA10 | A2 | 52 | RA20 | A4 | 45 | RA30 | A6 | 66 |

# SEMICONDUCTOR DEVICE AND REFRESH RATE CONTROL METHOD OF SEMICONDUCTOR DEVICE BASED ON MEASURED TEMPERATURE

CROSS-REFERENCE TO RELATED APPLICATION

This application is based upon and claims the benefit of priority of the prior Japanese Patent Application No. 2016-239175, filed on Dec. 9, 2016, the entire contents of which are incorporated herein by reference.

FIELD

The embodiment discussed herein is related to a semiconductor device and a control method of the semiconductor device.

BACKGROUND

A stacked memory device in which a plurality of memory chips each including a dynamic random access memory (DRAM) circuit are stacked so as to be connected to each other through Through Silicon Vias (TSVs) repeatedly performs a refresh operation at specific time intervals in order to avoid loss of a storage content (data) from a storage element of the DRAM circuit due to discharge. A discharge rate of electric charge from the storage element of the DRAM circuit becomes higher as the temperature becomes higher, so that it is desirable that a refresh interval of the refresh operation in the memory device is reduced and the execution frequency is increased as the temperature becomes higher.

In the stacked memory device, for example, temperature sensors are disposed in a logic chip in which an in-device logic circuit is disposed and in the plurality of memory chips, and the refresh operation is performed by setting the shortest refresh interval that is uniform for the whole memory in accordance with a memory block having the highest temperature based on measurement results by the temperature sensors. In addition, a technology has been proposed by which, in a stacked memory device in which a plurality of memory chips are stacked on a logic chip so as to be connected to the logic chip through TSVs, the maximum temperature of the memory device is determined based on a table of temperature distribution information when each circuit in the logic chip is operated, and a refresh operation is performed by setting a refresh interval based on the maximum temperature.

In a system having a memory device in the related art, since a transfer rate in the memory device has been low, transmission of a signal such as data has been able to be performed even when a processor and the memory device are mounted to be separated from each other at a certain distance. However, it has been started to mount a processor and a memory device to be close to each other because a stacked memory device, which improves a memory band in high performance computing (HPC) and network devices, has been standardized as a next-generation memory and an interface has been speeded up.

Power consumption and self-heat generating of the processor are increased due to the refinement of a process and the higher performance of the processor. A temperature difference occurs in the stacked memory device due to the influence of such self-heat generation of the circuit arranged in the periphery, however, the shortest refresh interval is set to even a part in which the temperature is low and it is only sufficient that the refresh interval is long, so that the execution frequency of the refresh operation is increased, resulting in increase in the power consumption of the stacked memory device.

The Following is a Reference Document. [Document 1] Japanese Laid-open Patent Publication No. 2015-41395.

SUMMARY

According to an aspect of the invention, a semiconductor device in which a plurality of chips each including a memory circuit are stacked, the semiconductor device includes measurement circuitry each of which is disposed in each of a plurality of memory areas of the plurality of chips and each of which measures a temperature, calculation circuitry that calculates a temperature of each of the memory areas based on the temperature measured by the measurement circuitry and a temperature obtained from a thermal resistance model of the semiconductor device, and control circuitry that sets a refresh interval of each of the memory areas based on the temperature of each of the memory areas, which has been calculated by the calculation circuitry, and performs a refresh operation of the memory circuit of each of the memory areas at the set refresh interval.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of the thermal resistance model according to the embodiment;

FIG. 6 is a diagram illustrating an example of a refresh condition table according to the embodiment;

FIG. 9A is a diagram illustrating correction of the thermal resistance model according to the embodiment; and FIG. 9B is a diagram illustrating an example of the thermal resistance model after the correction.

DESCRIPTION OF EMBODIMENT

An embodiment of the technology discussed herein is described below with reference to drawings.

Figure 1A:
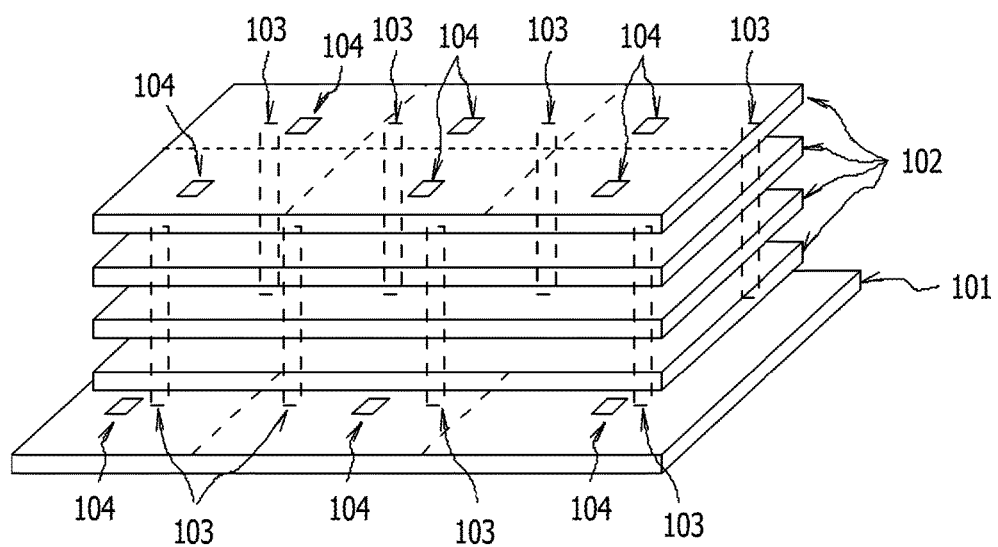
FIGS. 1A and 1B are diagrams each illustrating a configuration example of a stacked memory device according to an embodiment.

FIG. 1A is a diagram illustrating a configuration example of a stacked memory device as a semiconductor device according to an embodiment. As illustrated in FIG. 1A, the stacked memory device according to the embodiment includes a logic chip 101 in which a logic circuit is disposed and a plurality of memory chips (DRAM chips) 102 in each of which a DRAM circuit is disposed as a memory circuit. The plurality of memory chips 102 are stacked on the logic chip 101 and connected to the logic tip 101 through TSVs 103. Temperature sensors 104 are disposed in the logic chip 101 and the plurality of memory chips 102.

Figure 1B:
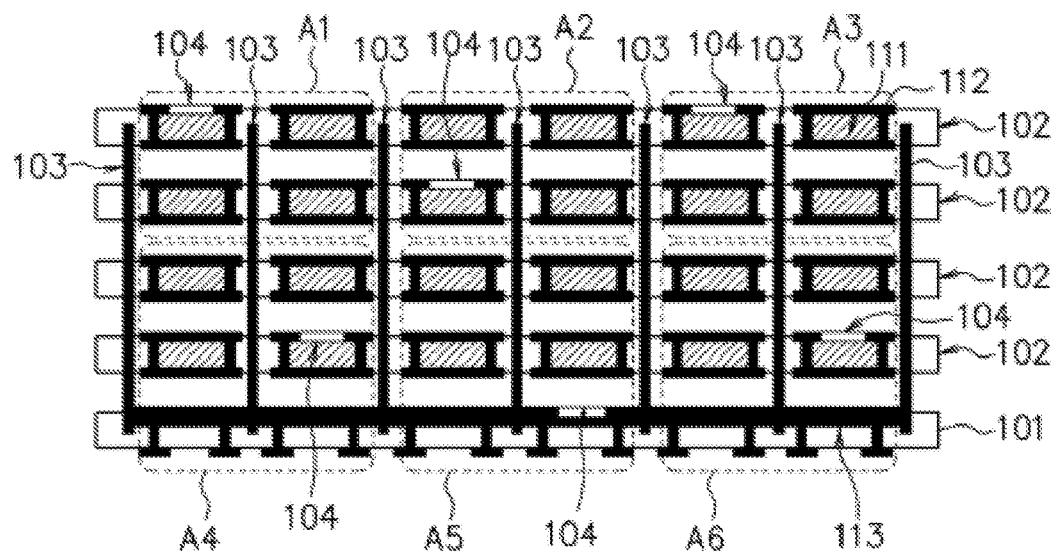

FIG. 1B is a cross-sectional view illustrating a configuration example of the stacked memory device according to the embodiment. In FIG. 1B, an area of a part of the logic chip 101 and the memory chips 102 included in the stacked memory device according to the embodiment is illustrated. In the memory chip 102, memory cells each including a storage element (capacitance element) are formed in memory cell areas 111. In addition, in the memory chip 102, a wiring 112 of the memory cell is formed. In the logic chip 101, a circuit element 113 including circuit elements of a logic circuit that realizes a specific function, a wiring, and the like is formed. The logic chip 101 and the memory chips 102 are connected to each other through the TSVs 103.

In the stacked memory device according to the embodiment, a time interval (refresh interval) at which a refresh operation is performed may be individually set for each of divided memory areas. In FIG. 1B, an example of division into memory areas A1 to A6 is illustrated. In each of the memory areas A1 to A6, a single temperature sensor 104 is disposed, and a refresh interval is set for each of the memory areas based on the measured value of the temperature sensor 104 and a temperature value obtained from a thermal resistance model. The temperature sensor 104 may be disposed not only in the logic chip 101 but also in the memory chips 102.

Figure 2:
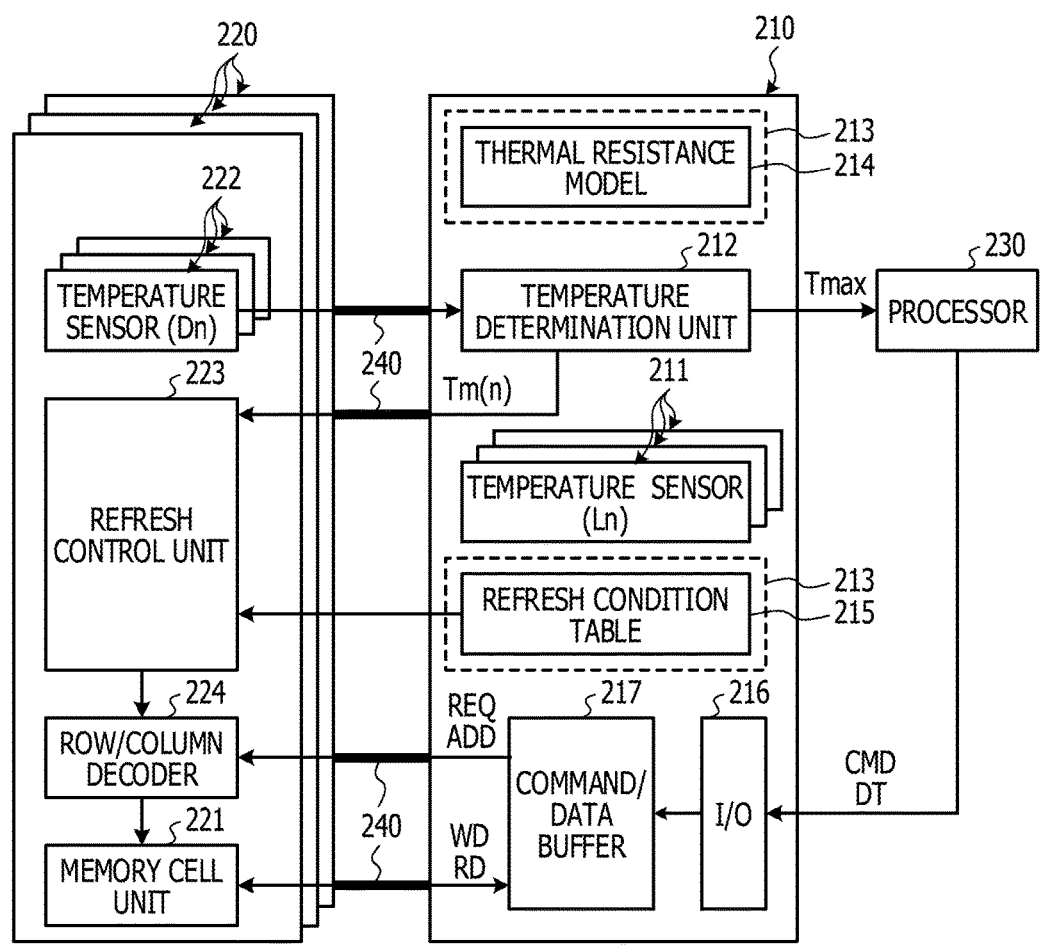
FIG. 2 is a diagram illustrating a functional configuration example of the stacked memory device according to the embodiment.

FIG. 2 is a diagram illustrating a functional configuration example of the stacked memory device according to the embodiment. A logic chip 210 includes temperature sensors (Ln) 211, a temperature determination unit 212, a storage unit 213, a command/data input/output unit 216, and a command/data buffer 217. In addition, each memory chip 220 includes a memory cell unit 221, temperature sensors (Dn) 222, a refresh control unit 223, and a row/column decoder 224. The logic chip 210 and the memory chip 220 transmit and receive various signals and pieces of data to and from each other through TSVs 240.

Each of the temperature sensors (Ln) 211 and the temperature sensors (Dn) 222 realize a function as a measurement unit, and measure a temperature of a corresponding memory area n. In each of the memory areas n, one temperature sensor (Ln) 211 or one temperature sensor (Dn) 222 is disposed. The storage unit 213 is, for example, a nonvolatile memory in which data is rewritable. In the storage unit 213, a thermal resistance model 214 and a refresh condition table 215 are stored.

The temperature determination unit 212 reads temperature values (measured values) from the temperature sensors (Ln) 211 of the logic chip 210 and the temperature sensors (Dn) 222 of the memory chips 220, determines the highest temperature, and notifies a processor 230 of the maximum temperature Tmax. The reading of the temperature values from the temperature sensors (Ln) 211 and the temperature sensors (Dn) 222 by the temperature determination unit 212 is periodically performed.

In addition, the temperature determination unit 212 realizes a function as a calculation unit and calculates a temperature value Tm (n) for each of the memory areas based on the temperature values that have been measured by the temperature sensor (Ln) 211 and the temperature sensor (Dn) 222 and temperature values that are obtained from the thermal resistance model 214. The temperature determination unit 212 outputs the calculated temperature value Tm (n) to the refresh control unit 223 of the memory chip 220. In addition, the temperature determination unit 212 realizes a function as an update unit, and corrects a setting value of the thermal resistance model 214 as appropriate in accordance with the calculated temperature value Tm (n) for each of the memory areas.

The command/data input/output unit 216 receives a command CMD that has been issued from the processor 230, and transmits and receives pieces of data DT to and from the processor 230. Examples of the command CMD issued from the processor 230 include a refresh command used to instruct execution of a refresh operation for the memory cell unit 221, a write command used to instruct writing of data to the memory cell unit 221, and a read command used to instruct reading of data from the memory cell unit 221. Here, the processor 230 periodically issues a refresh command at a time interval according to the maximum temperature Tmax that has been notified from the temperature determination unit 212 of the logic chip 210.

The command/data buffer 217 outputs various requests REQ such as a refresh request, a write access request, and a read access request, and an address ADD of an access request to the row/column decoder 224 of the memory chip 220, in accordance with commands input through the command/data input/output unit 216. In addition, the command/data buffer 217 transmits and receives write data WD that is to be written to the memory cell unit 221 and read data RD that has been read from the memory cell unit 221 to and from the memory cell unit 221.

In the memory chip 220, the memory cell unit 221 includes a plurality of memory cells arranged in a matrix. The refresh control unit 223 sets a refresh interval of the memory cell unit 221 in accordance with the temperature value Tm (n) for each of the memory areas, which has been provided from the logic chip 210 and the refresh condition table 215. For example, the refresh control unit 223 reduces the refresh interval so that the execution frequency of the refresh operation is increased for a memory area having a high temperature value Tm (n) and increases the refresh interval so that the execution frequency of the refresh operation is reduced for a memory area having a low temperature value Tm (n).

The row/column decoder 224 controls each control signal or the like related to an operation for the memory cells of the memory cell unit 221 in accordance with the request REQ and the address ADD from the logic chip 210. For example, when a refresh operation for the memory cells has been requested by the request REQ, the row/column decoder 224 controls each control signal or the like so that the refresh operation is performed at the refresh intervals each of which has been set by the refresh control unit 223.

In the example illustrated in FIG. 2, the logic chip 210 includes the plurality of temperature sensors 211, and the memory chip 220 includes the plurality of temperature sensors 222. However, as described above, a single temperature sensor 211 or 222 is provided in each of the memory areas, so that the logic chip 210 may not include the temperature sensor 211, or the memory chip 220 may not include the temperature sensor 222.

Figure 3:
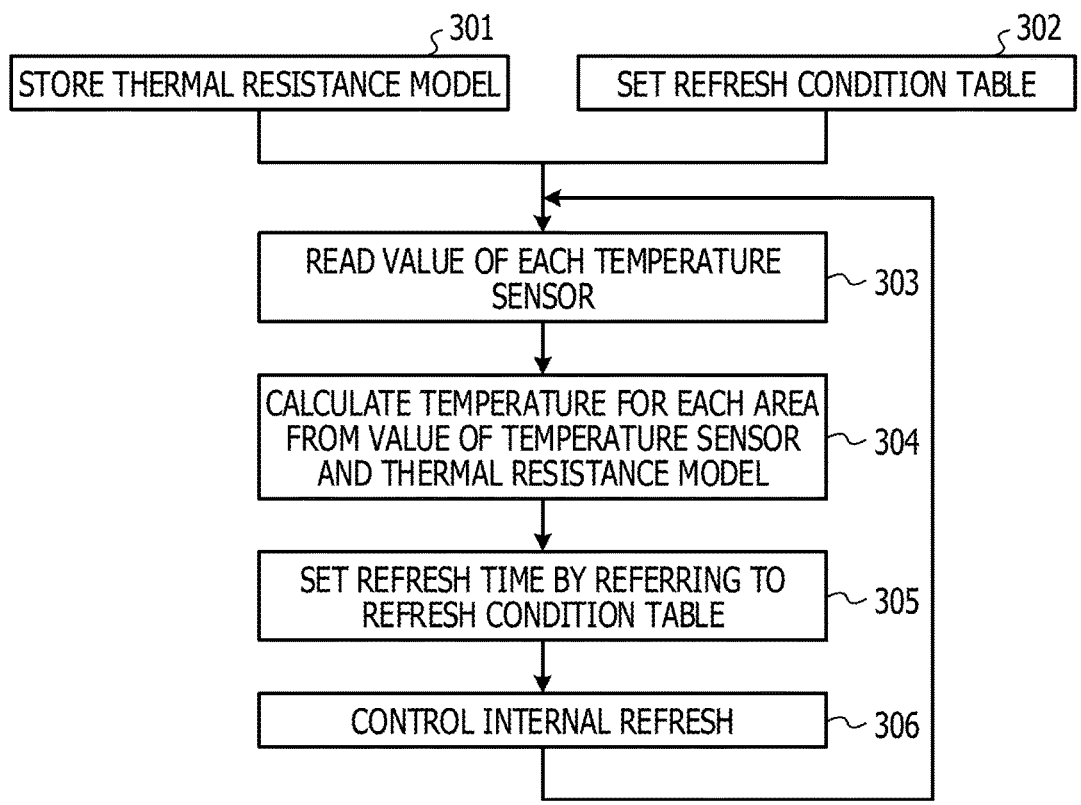
FIG. 3 is a diagram illustrating an example of refresh control of the stacked memory device according to the embodiment.

An operation of the stacked memory device according to the embodiment is described below. A data write operation and a data read operation in the stacked memory device according to the embodiment are same as the related art, so that the description is omitted herein, and in the following description, an operation related to refresh control is described. FIG. 3 is a diagram illustrating an example of refresh control in the stacked memory device according to the embodiment.

In the refresh control according to the embodiment, before the refresh control is performed, the thermal resistance model 214 in the stacked memory device and the refresh condition table 215 to which a condition has been set are stored in the storage unit 213 of the logic chip 210 (301 and 302). The thermal resistance model 214, which is obtained by performing a thermal simulation of the stacked memory device in advance and setting thermal resistance (RAx) values based on the structures of the logic chip 210 and the memory chips 220, is stored in the storage unit 213 of the logic chip 210. The refresh condition table 215 indicates setting of a refresh interval for each of the temperature values Tm (n) and is used to determine a refresh interval based on the temperature value Tm (n) for each of the memory areas, which is output from the temperature determination unit 212.

Figure 4:
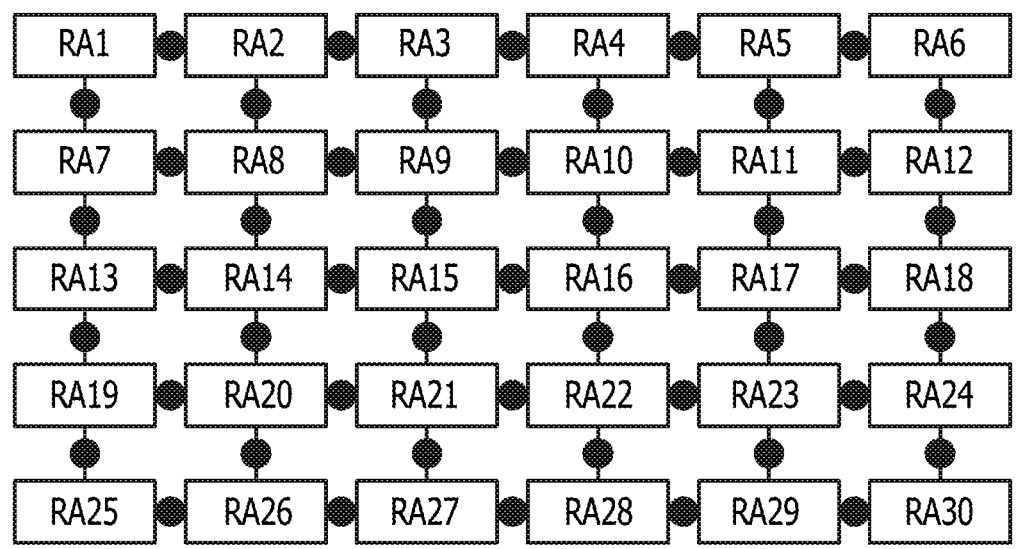
FIG. 4 is a diagram illustrating a thermal resistance model according to the embodiment.

FIG. 4 is an image diagram of the thermal resistance model corresponding to the configuration of the stacked memory device illustrated in FIG. 1B. In the example illustrated in FIG. 4, RA1 to RA30 are thermal resistances, and the RA1 to the RA6 are thermal resistances of the first memory chip 102 from the top, and the RA7 to the RA12 are thermal resistances of the second memory chip 102 from the top. The RA13 to the RA18 are thermal resistances of the third memory chip 102 from the top, and the RA19 to the RA24 are thermal resistances of the fourth memory chip 102 from the top. In addition, the RA25 to the RA30 are thermal resistances of the logic chip 101.

In addition, in the memory areas A1 to A6, the RA1, the RA2, the RA7, and the RA8 are thermal resistances of the memory area A1, and the RA3, the RA4, the RA9, and the RA10 are thermal resistances of the memory area A2, and the RA5, the RA6, the RA11, and the RA12 are thermal resistances of the memory area A3. In addition, the RA13, the RA14, the RA19, the RA20, the RA25, and the RA26 are thermal resistances of the memory area A4, and the RA15, the RA16, the RA21, the RA22, the RA27, and the RA28 are thermal resistances of the memory area A5, and the RA17, the RA18, the RA23, the RA24, the RA29, and the RA30 are thermal resistances of the memory area A6.

For example, it is assumed that the values of thermal resistances (RAx) are set to the thermal resistance model 214 illustrated in FIG. 4 as illustrated in FIG. 5. A temperature in each location in the stacked memory device may be calculated by performing specific calculation using the setting value of the corresponding thermal resistance (RAx), which has been set to the thermal resistance model 214. For convenience of explanation, in FIG. 4, a two-dimensional thermal resistance model is illustrated, but the thermal resistance model 214 stored in the storage unit 213 is a three-dimensional thermal resistance model similar to the stacked memory device.

In addition, in the embodiment, the setting values of the thermal resistance model 214 stored in the storage unit 213 may be rewritten. The temperature determination unit 212 corrects the setting values of the thermal resistance model 214 as appropriate in accordance with the temperature values that have been periodically read from the temperature sensors (Ln) 211 and the temperature sensors (Dn).

FIG. 6 is a diagram illustrating an example of the refresh condition table 215, and a refresh interval is set for a temperature value Tm (n). In the example illustrated in FIG. 6, when the temperature value Tm (n) is Ta [° C.] or more, the refresh interval is set at Ca [μs]. In addition, when the temperature value Tm (n) is Tb [° C.] or more and less than Ta [° C.], the refresh interval is set at Cb [μs] that is larger than Ca (for example, a cycle that is twice time Ca), and when the temperature value Tm (n) is Tc [° C.] or more and less than Tb [° C.], the refresh interval is set at Cc [μs] that is larger than Cb (for example, a cycle that is four times Ca).

Returning to FIG. 3, when the refresh control is started, the temperature determination unit 212 of the logic chip 210 reads values of the temperature sensors (Ln) 211 of the logic chip 210 and the temperature sensors (Dn) 222 of the memory chip 220 (303). In addition, the temperature determination unit 212 determines the highest temperature Tmax from among the read values and notifies the processor 230 of the determined highest temperature Tmax. After that, the temperature determination unit 212 calculates a temperature value Tm (n) for each of the memory areas, based on the values of the temperature sensors (Ln) 211 and the temperature sensors (Dn) 222 and the temperature values obtained from the thermal resistance model 214, and outputs the temperature value Tm (n) to the refresh control unit 223 of the memory chip 220 (304).

After that, the refresh control unit 223 sets a refresh interval according to the temperature value Tm (n) that has been transmitted from the temperature determination unit 212 for each of the memory areas, by referring to the refresh condition table stored in the logic chip 210 (305). In addition, the refresh control unit 223 and the row/column decoder 224 control the refresh operation for the memory cell unit 221 at the set refresh intervals (306). After that, the stacked memory device periodically executes the operations of 303 to 306.

Figure 7:
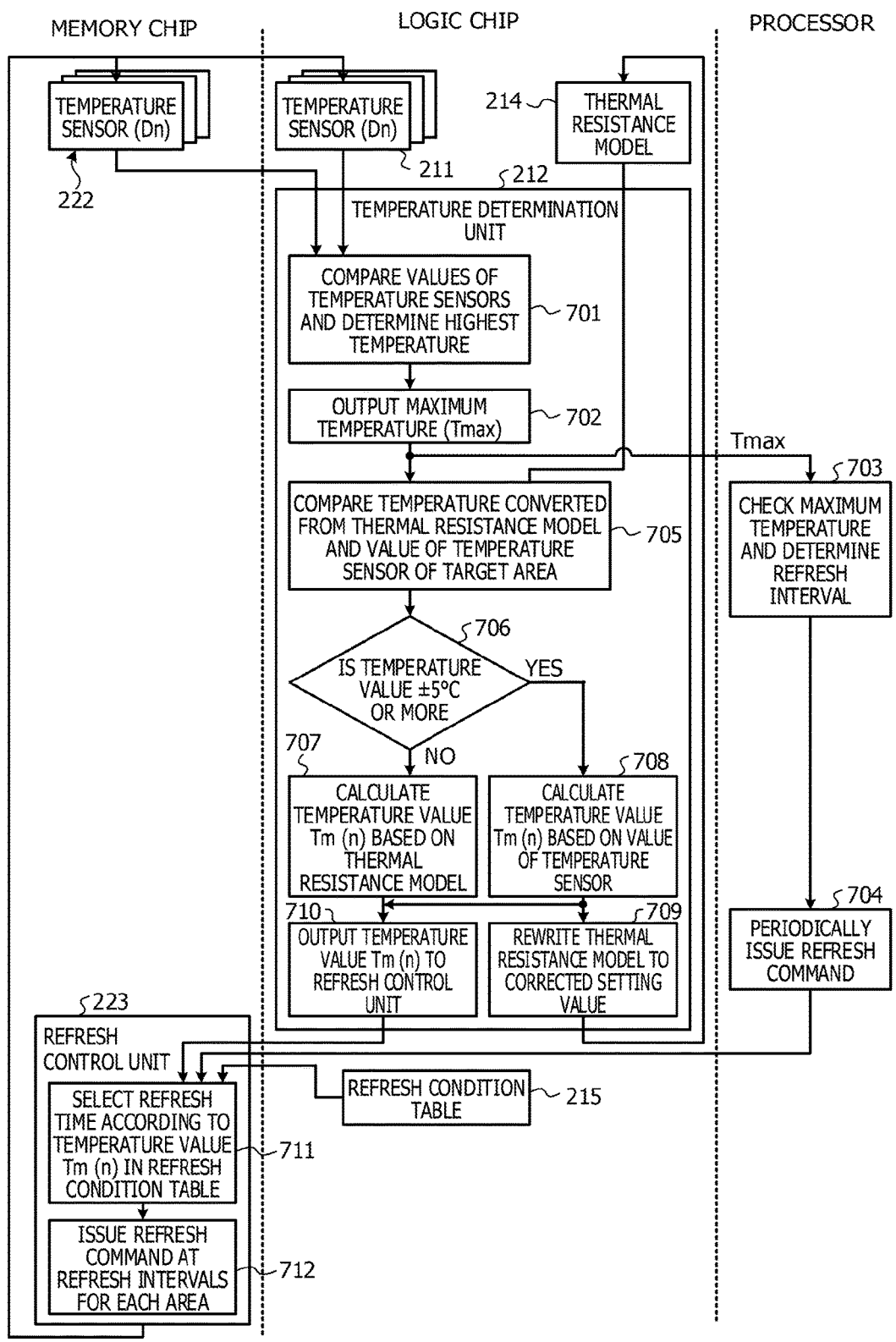
FIG. 7 is a diagram illustrating an example of refresh control processing according to the embodiment.

FIG. 7 is a diagram illustrating an example of a flow of refresh control processing in the stacked memory device according to the embodiment. In the following description, it is assumed that the thermal resistance model 214 is the model illustrated in FIGS. 4 and 5, and for convenience of explanation, it is assumed that the setting values of thermal resistances indicate temperatures that have been converted from the thermal resistance model. In addition, from among the temperatures that have been converted from the thermal resistance model 214 in the memory area n, a maximum value in the memory area n, that is, a maximum setting value of the thermal resistance in the memory area n is set as the temperature converted from the thermal resistance model 214 in this example.

The temperature determination unit 212 of the logic chip reads values of the temperature sensors (Ln) 211 of the logic chip and the temperature sensors (Dn) 222 of the memory chip, and determines the highest temperature Tmax by comparing the read values with each other (701). After that, the temperature determination unit 212 outputs the maximum temperature Tmax that has been obtained by the determination in the processing 701 to the processor (702).

The processor checks the maximum temperature Tmax that has been output from the temperature determination unit 212 of the logic chip, and determines a refresh cycle (refresh interval) according to the maximum temperature Tmax (703). In addition, the processor periodically issues a refresh command to the stacked memory device at the refresh cycles (refresh intervals) that have been determined in the processing 703 (704).

In addition, the temperature determination unit 212 of the logic chip compares the temperature that has been converted from the thermal resistance model 214 in the memory area n and the value of the temperature sensor (Dn) 222 (or the temperature sensor (Ln) 211) (705), and determines whether the temperature difference measured in 1 ms is ±5[° C.] or more (706). As a result of the determination in the processing 706, when the temperature determination unit 212 determines that the temperature difference is less than ±5[° C.] (NO), the temperature determination unit 212 determines that a temperature value Tm (n) of the memory area n is calculated from the thermal resistance model 214, and sets the temperature that has been converted from the thermal resistance model 214 in the memory area n as the temperature value Tm (n) (707).

In addition, as a result of the determination in the processing 706, when the temperature determination unit 212 determines that the temperature difference is ±5[° C.] or more (YES), the temperature determination unit 212 determines that a temperature value Tm (n) of the memory area n is calculated based on the value of the temperature sensor (Dn) 222 (or the temperature sensor (Ln) 211), and sets the value of the temperature sensor (Dn) 222 (or the temperature sensor (Ln) 211) of the memory area n as the temperature value Tm (n) (708). After the processing 708, the temperature determination unit 212 rewrites the thermal resistance (RAx) value in the memory area n of the thermal resistance model 214 to the corrected setting value (709).

In the processing 709, the temperature determination unit 212 increases and decreases the setting value before the correction by the temperature difference portion with the temperature sensor (Dn) 222 (or the temperature sensor (Ln) 211). For example, when the temperature that has been converted from the thermal resistance model 214 in the memory area n is higher than the value of the temperature sensor (Dn) 222 (or the temperature sensor (Ln) 211) by 5[° C.], the temperature determination unit 212 sets a value that has been obtained by subtracting 5 from the setting value before the correction as the setting value after the correction. In addition, for example, when the temperature that has been converted from the thermal resistance model 214 in the memory area n is lower than the value of the temperature sensor (Dn) 222 (or the temperature sensor (Ln) 211) by 6[° C.], the temperature determination unit 212 sets a value that has been obtained by adding 6 to the setting value before the correction as the setting value after the correction.

When the temperature value Tm (n) of the memory area n is obtained in the processing 707 or the processing 708, the temperature determination unit 212 outputs the temperature value Tm (n) to the refresh control unit 223 of the memory chip (710). Here, the processing 705 to 710 are executed for each of the memory areas n.

When the refresh control unit 223 of the memory chip receives the temperature value Tm (n) of the memory area n, which has been output from the temperature determination unit 212 of the logic chip, the refresh control unit 223 determines a refresh interval of the memory area n according to the temperature value Tm (n), by referring to the refresh condition table 215 (711). In addition, the refresh control unit 223 causes a refresh operation to be performed for the memory cells in response to a refresh command periodically issued from the processor at the determined refresh intervals (712).

For example, when the determined refresh interval is the same as the issuance cycle of the refresh commands from the processor, the refresh control unit 223 makes all of the refresh commands that have been issued from the processor valid and causes the refresh operation to be performed for the memory cells. In addition, for example, when the determined refresh interval is twice the issuance cycle of the refresh commands from the processor, the refresh control unit 223 makes the half of the refresh commands that have been issued from the processor valid and causes the refresh operation to be performed for the memory cells. In addition, for example, when the determined refresh interval is four times the issuance cycle of the refresh commands from the processor, the refresh control unit 223 makes the quarter of the refresh commands that have been issued from the processor valid and causes the refresh operation to be performed for the memory cells.

After that, the above-described processing is periodically executed, and the calculation of the temperature value Tm (n) of the memory area n and the correction of the thermal resistance model 214 are repeatedly performed as appropriately to perform the refresh control of the memory in the stacked memory device. In the example illustrated in FIG. 7, when the temperature difference is ±5[° C.] or more, the calculation of the temperature value Tm (n) based on the temperature sensor 211 or 222 and the correction of the setting value of the thermal resistance model 214 are performed, but a condition in which the calculation and the correction are performed is not limited to such an example, and a certain condition such as whether the temperature difference exceeds a specific range may be set. In addition, the maximum value in the memory area n of the temperatures that have been converted from the thermal resistance model 214 is employed as the temperature that has been converted from the thermal resistance model 214 in the memory area n, but, for example, an average value in the memory area n or a value at the location corresponding to the temperature sensor may be employed.

Figure 8:
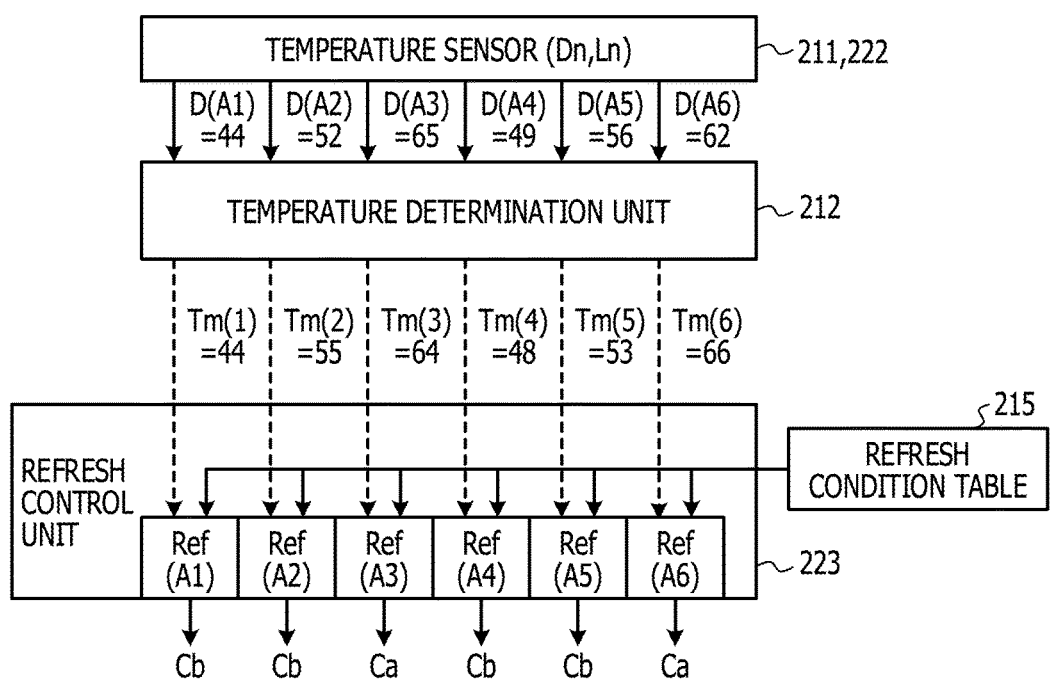
FIG. 8 is a diagram illustrating refresh control in the embodiment.

A specific example of calculation of a temperature value Tm (n) in the memory area n, setting of a refresh interval, and correction of the thermal resistance model is described with reference to FIGS. 8, 9A, and 9B. For example, as illustrated in FIG. 8, it is assumed that a temperature of the memory area n, which has been read from the temperature sensor 211 or 222, is 44[° C.] in the memory area A1, 52[° C.] in the memory area A2, 65[° C.] in the memory area A3, 49[° C.] in the memory area A4, 56[° C.] in the memory area A5, and 62[° C.] in the memory area A6. In addition, when the setting values of the thermal resistance model 214 illustrated in FIG. 5 are used, temperature values that have been converted from the thermal resistance model of the memory area n become as illustrated in FIG. 9A. That is, the temperature value that has been converted from the thermal resistance model is 49[° C.] in the memory area A1, 55[° C.] in the memory area A2, 64[° C.] in the memory area A3, 48[° C.] in the memory area A4, 53[° C.] in the memory area A5, and 66[° C.] in the memory area A6.

In this case, in the memory area A1, the temperature difference is 5[° C.], so that the temperature determination unit 212 sets the temperature that has been read from the temperature sensor 211 or 222 as the temperature value Tm (1) for the memory area A1. In addition, in the other memory areas A2 to A6, the temperature difference is less than 5[° C.], so that the temperature determination unit 212 sets the temperature values that have been converted from the thermal resistance model as the temperature values Tm (2) to Tm (6) for the memory areas A2 to A6. Thus, the temperature value Tm (n) of the memory area n, which is output from the temperature determination unit 212, is 44[° C.] in the memory area A1, 55[° C.] in the memory area A2, 64[° C.] in the memory area A3, 48[° C.] in the memory area A4, 53[° C.] in the memory area A5, and 66[° C.] in the memory area A6.

Here, for example, in the refresh condition table 215 illustrated in FIG. 6, it is assumed that Ta is 60[° C.], Tb is 20[° C.], and Tc is 0[° C.]. The refresh control unit 223 sets the refresh interval of the memory area A1 at Cb [µs]

because the temperature value Tm (1) is 44[° C.], and sets the refresh interval of the memory area A2 at Cb [μs] because the temperature value Tm (2) is 55[° C.]. In addition, the refresh control unit 223 sets the refresh interval of the memory area A3 at Ca [μs] because the temperature value Tm (3) is 64[° C.], and sets the refresh interval of the memory area A4 at Cb [μs] because the temperature value Tm (4) is 48[° C.]. Similarly, the refresh control unit 223 sets the refresh interval of the memory area A5 at Cb [μs] because the temperature value Tm (5) is 53[° C.], and sets the refresh interval of the memory area A6 at Ca [μs] because the temperature value Tm (6) is 66[° C.].

In addition, the temperature determination unit 212 corrects the setting value of the memory area A1 in the thermal resistance model 214 because the temperature difference between the temperature that has been read from the temperature sensor 211 or 222 in the memory area A1 and the temperature value that has been converted from the thermal resistance model is 5[° C.]. As illustrated in FIG. 9A, the setting values before the correction of the thermal resistances RA1, RA2, RA7, and RA8 of the memory area A1 in the thermal resistance model 214 are 48, 49, 44, and 49, respectively. The temperature value that has been converted from the thermal resistance model is higher than the temperature that has been read from the temperature sensor 211 or 222 by 5[° C.], so that the temperature determination unit 212 corrects setting values of the thermal resistances RA1, RA2, RA7, and RA8 into 48, 44, 44, and 44 obtained by subtracting 5 merely from the setting values that are higher by 5[° C.]. Thus, as illustrated in FIG. 9B, in the thermal resistance model 214 stored in the logic chip, setting values 901 and 902 of the memory area A1 are rewritten.

As described above, the stacked memory device according to the embodiment calculates a temperature value Tm (n) of each of the memory areas, based on the temperature value that has been read from the temperature sensor 211 of the logic chip 210 or the temperature sensor 222 of the memory chip 220, and the temperature value that has been obtained from the thermal resistance model 214. In addition, the stacked memory device performs a refresh operation by setting a refresh interval for each of the memory areas in accordance with the calculated temperature value Tm (n). As a result, the stacked memory device may perform the refresh operation at short refresh intervals for a memory area having a high temperature value Tm (n), and may perform the refresh operation at long refresh intervals for a memory area having a low temperature value Tm (n) without usage of a uniform refresh interval for the whole memory. Thus, the stacked memory device according to the embodiment may realize optimization by adjusting the refresh interval depending on a temperature distribution, and reduce the power consumption by performing the refresh operation at an appropriate refresh interval according to the temperature for each of the memory areas.

In addition, when a temperature difference between the temperature that has been read from the temperature sensor 211 or 222 and the temperature value that has been converted from the thermal resistance model 214 exceeds the specific range, the stacked memory device according to the embodiment corrects the setting value of the thermal resistance model 214 so that the temperature difference is reduced. The thermal resistance model 214 may be updated so as to conform to the operation state or the like of the stacked memory device, and the accuracy of the thermal resistance model 214 is improved, and the refresh interval may be optimized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device in which a plurality of chips each including a memory circuit are stacked, the semiconductor device comprising:
    measurement circuitry each of which is disposed in each of a plurality of memory areas of the plurality of chips and each of which measures a temperature;
    calculation circuitry that calculates a temperature of each of the memory areas based on the temperature measured by the measurement circuitry and a temperature obtained from a thermal resistance model of the semiconductor device; and
    control circuitry that sets a refresh interval of each of the memory areas based on the temperature of each of the memory areas, which has been calculated by the calculation circuitry, and performs a refresh operation of the memory circuit of each of the memory areas at the set refresh interval, and the control circuitry sets the refresh interval according to the temperature for each of the memory areas, which is calculated by the calculation circuitry, by referring to a table indicating setting of the refresh interval for the temperature.

2. The semiconductor device according to claim 1, further comprising:
    an update circuitry that updates a setting value of the thermal resistance model in the memory area in which the measurement circuitry is provided, based on the temperature measured by the measurement circuitry when a temperature difference between the temperature measured by the measurement circuitry and the temperature obtained from the thermal resistance model of the semiconductor device exceeds a specific range.

3. The semiconductor device according to claim 2, wherein the update circuitry updates the setting value of the thermal resistance model so that the temperature difference between the temperature measured by the measurement circuitry and the temperature obtained from the thermal resistance model of the semiconductor device is reduced.

4. The semiconductor device according to claim 1, wherein each of the measurement circuitry is disposed in each of the memory areas.

5. The semiconductor device according to claim 1, wherein the calculation circuitry sets the temperature measured by the measurement circuitry as the temperature of the memory area when a temperature difference between the temperature measured by the measurement circuitry and the temperature obtained from the thermal resistance model of the semiconductor device exceeds a specific range, and sets the temperature obtained from the thermal resistance model of the semiconductor device as the temperature of the memory area when the temperature difference does not exceed the specific range.

6. The semiconductor device according to claim 1, wherein the memory circuit is a dynamic random access memory circuit.

7. A control method of a semiconductor device in which a plurality of chips each including a memory circuit are stacked, the control method comprising:
- measuring a temperature by each of measurement circuitry disposed in each of a plurality of memory areas of the plurality of chips;
- calculating a temperature of each of the memory areas based on the temperature measured by the measurement circuitry and a temperature obtained from a thermal resistance model of the semiconductor device;
- setting a refresh interval of each of the memory areas based on the calculated temperature of each of the memory areas and setting the refresh interval according to the temperature for each of the memory areas, which is calculated by the calculation circuitry, by referring to a table indicating setting of the refresh interval for the temperature; and
- performing a refresh operation of the memory circuit of each of the memory areas at the set refresh interval.

* * * * *